(12) United States Patent
Kim et al.

(10) Patent No.: US 9,165,896 B2
(45) Date of Patent: Oct. 20, 2015

(54) GAN TRANSISTOR WITH IMPROVED BONDING PAD STRUCTURE AND METHOD OF FABRICATING THE SAME

(71) Applicant: Electronics and Telecommunications Research Institute, Daejeon (KR)

(72) Inventors: Hae Cheon Kim, Daejeon (KR); Ho Kyun Ahn, Daejeon (KR); Byoung Gue Min, Sejong (KR); Hyung Sup Yoon, Daejeon (KR); Jong Won Lim, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 14/453,969

(22) Filed: Aug. 7, 2014

(65) Prior Publication Data
US 2015/0206847 A1     Jul. 23, 2015

(30) Foreign Application Priority Data
Jan. 17, 2014   (KR) .......................... 10-2014-0006091

(51) Int. Cl.
*H01L 33/00*   (2010.01)
*H01L 23/00*   (2006.01)

(52) U.S. Cl.
CPC ............... *H01L 24/05* (2013.01); *H01L 24/03* (2013.01); *H01L 2224/03848* (2013.01); *H01L 2224/0401* (2013.01); *H01L 2224/05084* (2013.01); *H01L 2224/05124* (2013.01); *H01L 2224/05144* (2013.01); *H01L 2224/05155* (2013.01); *H01L 2224/05166* (2013.01); *H01L 2924/1033* (2013.01); *H01L 2924/13091* (2013.01); *H01L 2924/201* (2013.01)

(58) Field of Classification Search
CPC ............... H01L 2224/0501; H01L 2224/0503; H01L 2224/05075; H01L 2224/05078; H01L 2224/05084
See application file for complete search history.

(56) References Cited

U.S. PATENT DOCUMENTS

| | | | |
|---|---|---|---|
| 7,354,782 B2 | 4/2008 | Mishra et al. | |
| 7,375,383 B2 | 5/2008 | Nakamura et al. | |
| 8,519,548 B2 | 8/2013 | Won | |

FOREIGN PATENT DOCUMENTS

| | | |
|---|---|---|
| KR | 10-2001-0002265 A | 1/2001 |
| KR | 10-0407773 B1 | 12/2003 |

*Primary Examiner* — Matthew Reames
*Assistant Examiner* — John Bodnar
(74) *Attorney, Agent, or Firm* — Rabin & Berdo, P.C.

(57) ABSTRACT

The present invention relates to a GaN transistor, and a method of fabricating the same, in which a structure of a bonding pad is improved by forming an ohmic metal layer at edges of the bonding pad of a source, a drain, and a gate so as to be appropriate to wire-bonding or a back-side via-hole forming process. Accordingly, adhesive force between a metal layer of the bonding pad and a GaN substrate is enhanced by forming the ohmic metal at the edges of the bonding pad during manufacturing of the GaN transistor, thereby minimizing a separation phenomenon of a pad layer during the wire-bonding or back-side via-hole forming process, and improving reliability of a device.

7 Claims, 2 Drawing Sheets

GAN TRANSISTOR WITH IMPROVED BONDING PAD STRUCTURE AND METHOD OF FABRICATING THE SAME

CROSS-REFERENCE TO RELATED APPLICATIONS

This application is based on and claims priority from Korean Patent Application No. 10-2014-0006091, filed on Jan. 17, 2014, with the Korean Intellectual Property Office, the disclosure of which is incorporated herein in its entirety by reference.

BACKGROUND

1. Field

The present invention relates to a GaN transistor and a method of fabricating the same. More particularly, the present invention relates to a GaN transistor, in which a bonding pad structure is improved to be appropriate to a wire bonding process or a back-side via-hole forming process to enhance adhesive force, thereby increasing a yield and improving reliability, and a method of fabricating the same.

2. Discussion of Related Art

Recently, a GaN transistor has been widely used as an ultrahigh frequency high-power device used in a radar for a war machine and a transceiver for a mobile communication base station. The high-power GaN transistor is generally mounted in a transceiver in a packaged form in a unit device form, or in a form of a Monolithic Microwave Integrated Circuit (MMIC).

In this case, for the packaging or the interconnection, a drain electrode and a gate electrode are mostly wire-bonded, and a source pad is connected by wire-bonding or a back-side via-hole forming process, and thus a bonding pad for a connection with an external device is fabricated in the transistor or the MMIC. The bonding pad in the GaN transistor or the GaN MMIC in a batch process is generally formed by plating gold on a gate metal (nickel/gold) or a first metal interconnection (titanium/gold).

However, there is a case where adhesive force between the bonding pad and a wafer is poor according to a process condition, and during the wire bonding or the back-side via-hole forming process, the bonding pad is detached or the pad is separated during an operation, so that a life of a chip may be decreased.

SUMMARY

In this respect, the present inventors conducted research in order to solve the aforementioned problem, and found that when a structure and a process of a bonding pad is optimized in order to achieve excellent reliability of a GaN high-power transistor, adhesive force between a surface of GaN and the bonding pad is enhanced, so that it is possible to provide a GaN transistor with a high yield and excellent reliability, and completes the present invention.

The present invention has been made in an effort to provide a GaN transistor with an increased yield and excellent reliability by optimizing a structure of a bonding pad and enhancing adhesive force between a GaN surface and the bonding pad.

Further, the present invention has been made in an effort to provide a method of fabricating a GaN transistor with an increased yield and excellent reliability, which optimizes a structure and a process of a bonding pad during manufacturing of the GaN transistor to enhance adhesive force between a GaN surface and the bonding pad.

An embodiment of the present invention provides a GaN transistor including a bonding pad structure, including: an ohmic metal layer formed at edges of a boning pad of a source, a drain, and a gate; a first metal layer formed on the entire bonding pad on which the ohmic metal layer is formed; and a gold plated layer formed on the first metal layer.

The ohmic metal layer may be positioned at each of the edges of the bonding pad by an area corresponding to 10 to 50% of an entire area of the bonding pad. Further, the ohmic metal layer may have a metal structure in which a titanium layer, an aluminum layer, a nickel layer, and a gold layer are sequentially stacked.

Another embodiment of the present invention provides a method of fabricating a GaN transistor, including: forming an ohmic metal layer at edges of a boning pad of a source, a drain, and a gate; performing a thermal treatment on the ohmic metal layer; forming a first metal layer on the entire bonding pad on which the ohmic metal layer is formed; and forming a gold plated layer on the first metal layer.

The ohmic metal layer may be positioned at each of the edges of the bonding pad by an area corresponding to 10 to 50% of an entire area of the bonding pad. Further, the ohmic metal layer may have a metal structure of titanium/aluminum/nickel/gold.

Further, the thermal treatment may be performed at a temperature of 900 to 950° C.

According to the embodiment of the present invention, adhesive force between a metal layer of the bonding pad and a GaN substrate is enhanced by forming the ohmic metal at the edges of the bonding pad during manufacturing of the GaN transistor, thereby minimizing a separation phenomenon of a pad layer during the wire-bonding or the back-side via-hole forming process, and improving reliability of a device.

Further, an original metal layer is formed at a center portion of the bonding pad, so that the wire-bonding or the back-side via-hole forming process is not influenced, and a separate mask is not used, so that an additional process cost is not generated.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and advantages of the present invention will become more apparent to those of ordinary skill in the art by describing in detail embodiments thereof with reference to the attached drawings in which.

DETAILED DESCRIPTION

Hereinafter, the present invention will be described in detail. The above objects, other objects, characteristics, and advantages of the present invention may be easily understood through the exemplary embodiment below related to the accompanying drawings. However, the present invention is not limited to the exemplary embodiments described herein, and may be implemented in various different forms. On the contrary, exemplary embodiments introduced herein are provided to make disclosed contents thorough and complete and sufficiently transfer the spirit of the present invention to those skilled in the art.

Figure 1:
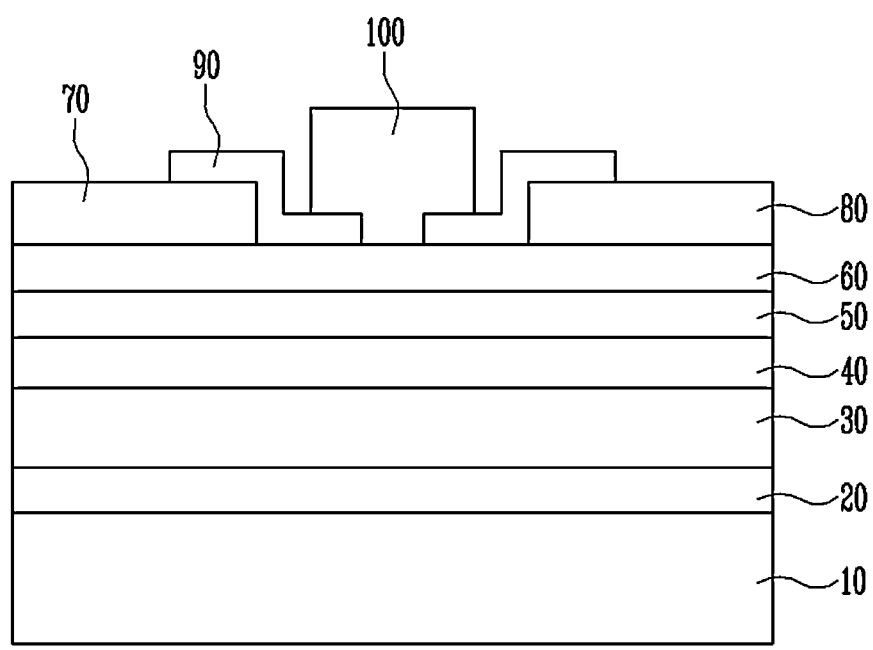
FIG. 1 is a cross-sectional view illustrating a structure of a GaN transistor.

FIG. 1 is a cross-sectional view illustrating a structure of a GaN transistor.

Referring to FIG. 1, a GaN transistor includes an SiC substrate 10, a transition layer 20, a GaN buffer layer 30, an undoped GaN channel layer 40, an undoped AlGaN layer 50, an undoped GaN cap layer 60, a source electrode 70, a drain electrode 80, a silicon nitride layer 90, and a gate electrode 100.

The substrate is an epitaxial substrate formed by stacking the transistor layer 20 and the GaN buffer layer on the semi-insulating silicon carbide (or high-resistance silicon) substrate 10, and then forming the GaN based channel layers 40, 50, and 60.

In general, in the GaN-based channel layer, the undoped AlGaN layer 50 having a wider band gap and the undoped GaN layer 60 are stacked on the undoped GaN channel layer 40, so that a 2-dimensional electronic layer is formed on an upper portion of GaN that is a channel layer.

Then, in order to fabricate the GaN transistor, an ohmic metal is deposited on regions of the source 70 and the drain 80, and thermal treatment is performed on the ohmic metal to form an ohmic contact layer. Then, after a process of forming the transistor is performed in an order of a device isolating process by implant, a silicon nitride depositing process, a gate foot forming process, and a deposition process of the gate metal 100, the source pad is connected by a gold plating process and a silicon nitride layer passivation layer is formed for decreasing resistance of a metal interconnection and protecting a device to form the GaN transistor.

Figure 2:
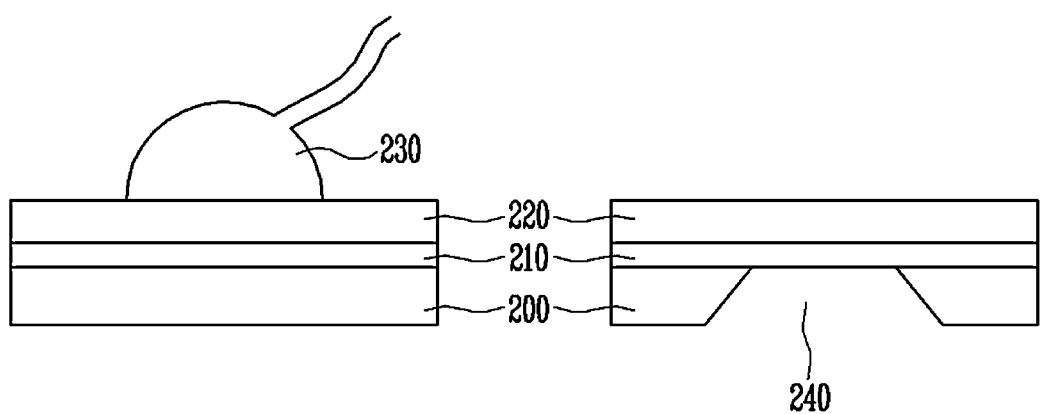
FIG. 2 is a cross-sectional view illustrating a bonding pad structure in a GaN transistor in the related art.

A structure of the bonding pad in the related art is illustrated in FIG. 2. That is, as illustrated in FIG. 2, in a general bonding pad, a pattern is formed on the bonding pad when a first metal layer 210, for example, a gate metal (nickel/gold) or a first metal interconnection (titanium/gold), is formed on a GaN epitaxial substrate 200 for deposition. Next, the bonding pad is formed by forming a gold plated layer 220. However, adhesive force between a surface of the GaN epitaxial substrate 200 and nickel or titanium that is metal being in contact with the surface of the GaN epitaxial substrate 200 is poor, so that there occurs a case in which the bonding pad metal is separated during the bonding of the wire 230 or the bonding pad is separated during a process of forming a via-hole 240, and thus a yield of a chip may deteriorate or the pad is separated during an operation of the device, thereby decreasing a life of the device.

Figure 3:
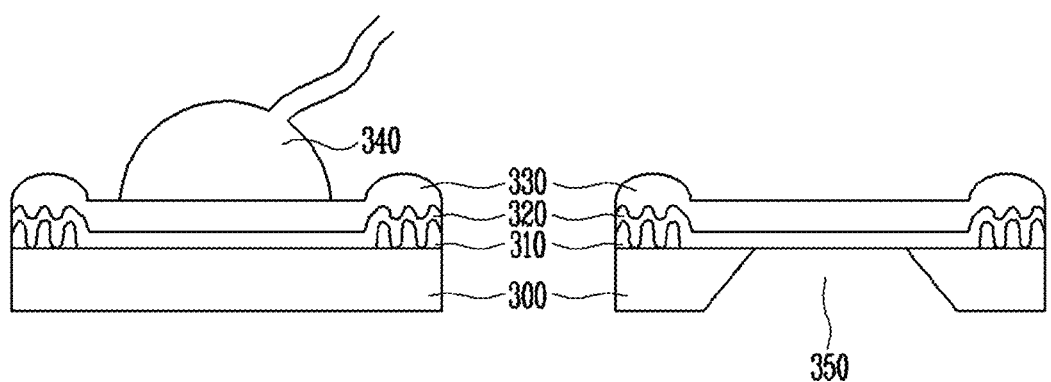
FIG. 3 is a cross-sectional view illustrating a bonding pad structure in a GaN transistor according to an exemplary embodiment of the present invention.

Accordingly, a structure of a bonding pad illustrated in FIG. 3 is adopted in the present invention. Referring to FIG. 3, in the bonding pad according to the present invention, first, an ohmic metal layer 310 is formed only on an edge of the bonding pad of a source, a drain, and a gate on a GaN epitaxial substrate 300, and the ohmic metal layer 310 is subjected to a thermal treatment.

Here, the ohmic metal layer 310 may be formed at each of the edges of the bonding pad by an area corresponding to 10 to 50% of the entire area of the bonding pad. For example, a sum of areas of the left- and right edges may be 10 to 50% of the entire area.

When the ohmic metal layer 310 is formed to have an area less than 10% of the entire area, enhancement of adhesive force may be slight, and when the ohmic metal layer 310 is formed to have an area more than 50% of the entire area, the wire may not be bonded well due to rough surface luminance at a portion at which the ohmic meal layer is formed.

The ohmic metal layer 310 may be deposited by a general method in the art, for example, an electron-beam evaporation method and sputtering.

The ohmic metal layer 310 according to the present invention generally has a metal structure of titanium/aluminum/nickel/gold, and for example, a titanium layer having a thickness of about 300 Å, an aluminum layer having a thickness of about 1000 Å, a nickel layer having a thickness of about 300 Å, and a gold layer having a thickness of about 1000 Å are sequentially stacked. In addition, the ohmic metal layer 310 may have a structure, such as Ti/Al/Mo/Au, Ti/Al/Pt/Au, and Ta/Ti/Al/Ni/Au. Further, the ohmic metal layer 310 may have a thickness of 2500 to 3000 Å. The ohmic metal layer 310 formed in a multi-layer is reacted during the thermal treatment, so that an alloy, such as TiN and Au—Al, is formed. For example, the ohmic metal layer 310 may be thermally treated at a temperature of 900 to 950° C., which is higher than an Al melting point (660° C.).

Further, adhesive force between the ohmic metal and a surface of the GaN epitaxial substrate is enhanced by inter-diffusion of the ohmic metal and the GaN epitaxial substrate, thereby minimizing a separation phenomenon of the bonding pad and improving reliability of the device.

However, in a case where the ohmic metal 310 having the structure of titanium/aluminum/nickel/gold is formed, an aluminum/gold alloy is formed during a high-temperature thermal treatment, which becomes a cause of forming very rough surface luminance of the ohmic metal. The rough surface luminance may decrease a contact area of an end portion of the wire, so that the bonding may not be well-formed during the wire bonding 340, and further, since nickel serves as a mask in the process of forming the back-side via-hole 350, a contact layer of the bonding pad at a region at which the via-hole is formed may be formed of nickel.

Accordingly, in the bonding pad according to the present invention, the wire-bonded portion or the portion of the bonding pad connected by the back-side via-hole maintains its original metal form, and the ohmic metal layer is formed only at the edges, except for the wire-bonded portion or the portion of the bonding pad connected by the back-side via-hole, so that it is possible to enhance adhesive force between the bonding pad and the GaN substrate, and fabricate the bonding pad having a high yield during the wire-bonding or the back-side via-hole forming process, and with excellent reliability.

Next, a first metal layer 320 is deposited on a substrate 300 on which the ohmic metal layer 310 is formed. The first metal layer 320 may be a gate metal or a first metal interconnection.

The gate metal may be a metal generally used in this field, for example, nickel/gold. Further, the first metal interconnection may also be a metal generally used in this field, for example, titanium/gold.

The first metal layer 320 may be formed by a general method in this field, and for example, an electron-beam evaporation method and sputtering.

Gold may be plated on a gold plated layer 330 formed on the first metal layer 320 with a thickness generally allowed in this field by an electrogliding method.

Further, the respective layers may be patterned by a general method in this field, for example, a lithography process or a lift-off method, as necessary.

In the bonding pad having the aforementioned structure, the wire bonding 340 and the process of forming the via-hole 350 are performed, and the ohmic metal layer is formed only at the edges to enhance adhesive force between the bonding pad and the GaN substrate, thereby fabricating the bonding pad having a high yield during the wire-bonding or the back-side via-hole forming process, and with excellent reliability.

Figure 4:
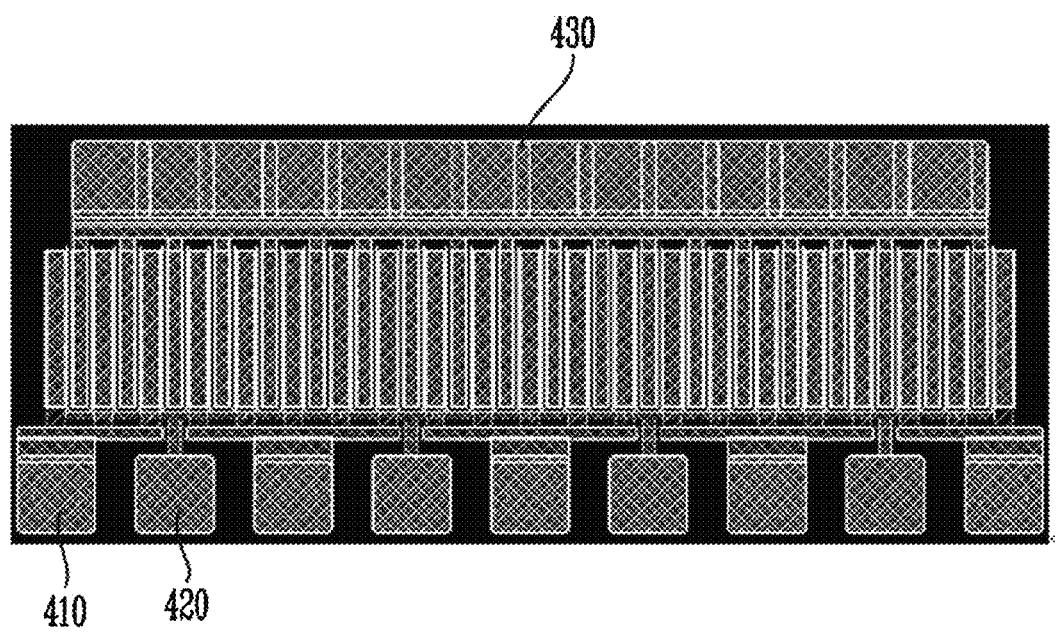
FIG. 4 is a layout view of the GaN transistor.

FIG. 4 is a layout view of the GaN transistor. As illustrated in FIG. 4, in order to package a GaN power device or interconnect with an external circuit, a drain bonding pad 420 and a gate bonding pad 430 are wire-bonded, and a source bonding pad 410 is packaged or connected with an external circuits through wire bonding or the back-side via hole.

As described above, the embodiment has been disclosed in the drawings and the specification. The specific terms used herein are for purposes of illustration, and do not limit the scope of the present invention defined in the claims. Accordingly, those skilled in the art will appreciate that various modifications and another equivalent example may be made without departing from the scope and spirit of the present disclosure. Therefore, the sole technical protection scope of the present invention will be defined by the technical spirit of the accompanying claims.

What is claimed is:

1. A GaN transistor including a bonding pad structure, comprising:
    a GaN substrate,
    a source, a drain and a gate formed on the GaN substrate;
    bonding pads of the source, the drain and the gate formed on the GaN substrate;
    an ohmic metal layer formed only at edges of a surface of each of the bonding pads of the source, the drain, and the gate;
    a first metal layer formed on the surface of each of the bonding pads on which the ohmic metal layer is formed and on the ohmic metal layer; and
    a layer comprising gold formed on the first metal layer.

2. The GaN transistor of claim 1, wherein the ohmic metal layer is positioned at each of the edges of the bonding pads by an area corresponding to 10 to 50% of an entire area of the bonding pad.

3. The GaN transistor of claim 1, wherein the ohmic metal layer has a metal structure in which a titanium layer, an aluminum layer, a nickel layer, and a gold layer are sequentially stacked.

4. A method of fabricating a GaN transistor, comprising:
    forming an ohmic metal layer at edges of a bonding pad of a source, a drain, and a gate;
    performing a thermal treatment on the ohmic metal layer;
    forming a first metal layer directly on the bonding pad on which the ohmic metal layer is formed and on the ohmic metal layer; and
    forming a layer comprising gold on the first metal layer.

5. The method of claim 4, wherein the ohmic metal layer is formed at each of the edges of the bonding pads by an area corresponding to 10 to 50% of an entire area of the bonding pad.

6. The method of claim 4, wherein the ohmic metal layer has a metal structure in which a titanium layer, an aluminum layer, a nickel layer, and a gold layer are sequentially stacked.

7. The method of claim 4, wherein the thermal treatment is performed at a temperature of 900 to 950° C.

* * * * *